(12) United States Patent
Baik et al.

(10) Patent No.: US 7,183,708 B2
(45) Date of Patent: Feb. 27, 2007

(54) ORGANIC ELECTRO LUMINESCENCE DISPLAY DEVICE AND FABRICATING METHOD THEREOF

(75) Inventors: Kwang Heum Baik, Gyeongsangbuk-do (KR); Do Young Rum, Daegu (KR); Ki Hong Kim, Gyeongsangbuk-do (KR); Jung Hwan Lee, Daegu (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/224,135

(22) Filed: Sep. 13, 2005

(65) Prior Publication Data

US 2006/0055318 A1   Mar. 16, 2006

(30) Foreign Application Priority Data

Sep. 14, 2004   (KR) ............... 10-2004-0073282

(51) Int. Cl.
*H01J 9/04* (2006.01)
*H01J 1/62* (2006.01)
*H01J 1/88* (2006.01)

(52) U.S. Cl. ............ 313/504; 313/292; 313/512; 313/506; 313/505; 445/51

(58) Field of Classification Search ............ 313/292, 313/238, 512
See application file for complete search history.

(56) References Cited

U.S. PATENT DOCUMENTS 6,819,391 B2 * 11/2004 Kim et al. .......... 349/157
2003/0030766 A1 * 2/2003 Kiguchi et al. ......... 349/106
2004/0124770 A1 * 7/2004 Hayashi et al. ........ 313/506
2006/0055317 A1 * 3/2006 Baik et al. ............. 313/504

FOREIGN PATENT DOCUMENTS

KR   10-2003-0079429 A   10/2003

* cited by examiner

*Primary Examiner*—Nimeshkumar D. Patel
*Assistant Examiner*—Natalie K. Walford
(74) *Attorney, Agent, or Firm*—Birch, Stewart, Kolasch & Birch, LLP

(57) ABSTRACT

There is disclosed an organic electro luminescence display device that is adaptive for preventing the deterioration of its light emitting efficiency and picture quality, and a fabricating method thereof.

An organic electro luminescence display device that is adaptive for preventing the deterioration of its light emitting efficiency and picture quality, and a fabricating method thereof are provided. The organic electro luminescence display device as embodied includes an organic electro luminescence array having first and second electrodes formed on a substrate with an organic light emitting layer therebetween, and a barrier rib in parallel to any one of the first and second electrodes; a protective barrier rib formed to enclose the organic electro luminescence array; and at least one dummy barrier rib located inside a corner area of the protective barrier rib and formed to be bent along the protective barrier rib.

7 Claims, 12 Drawing Sheets

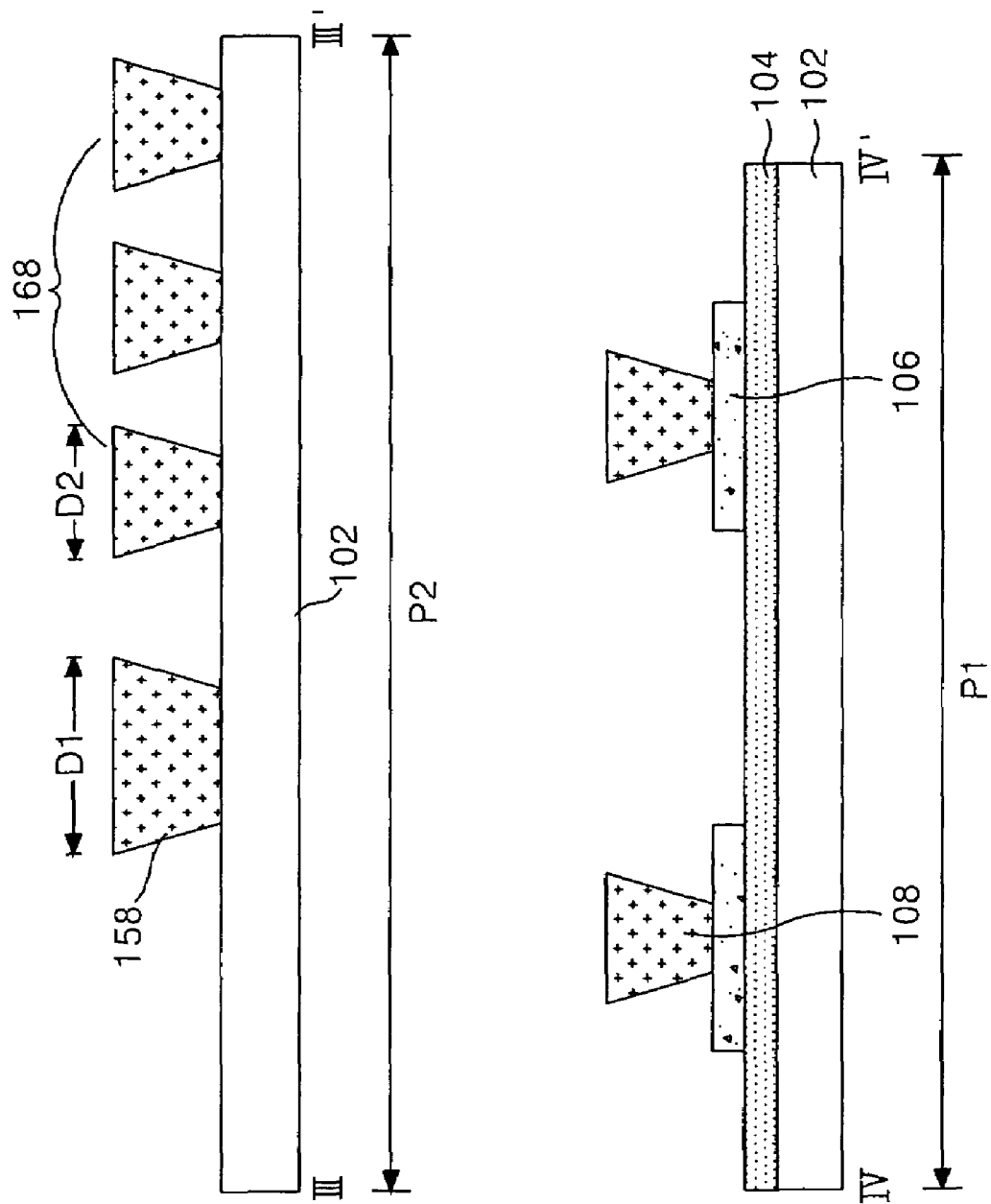

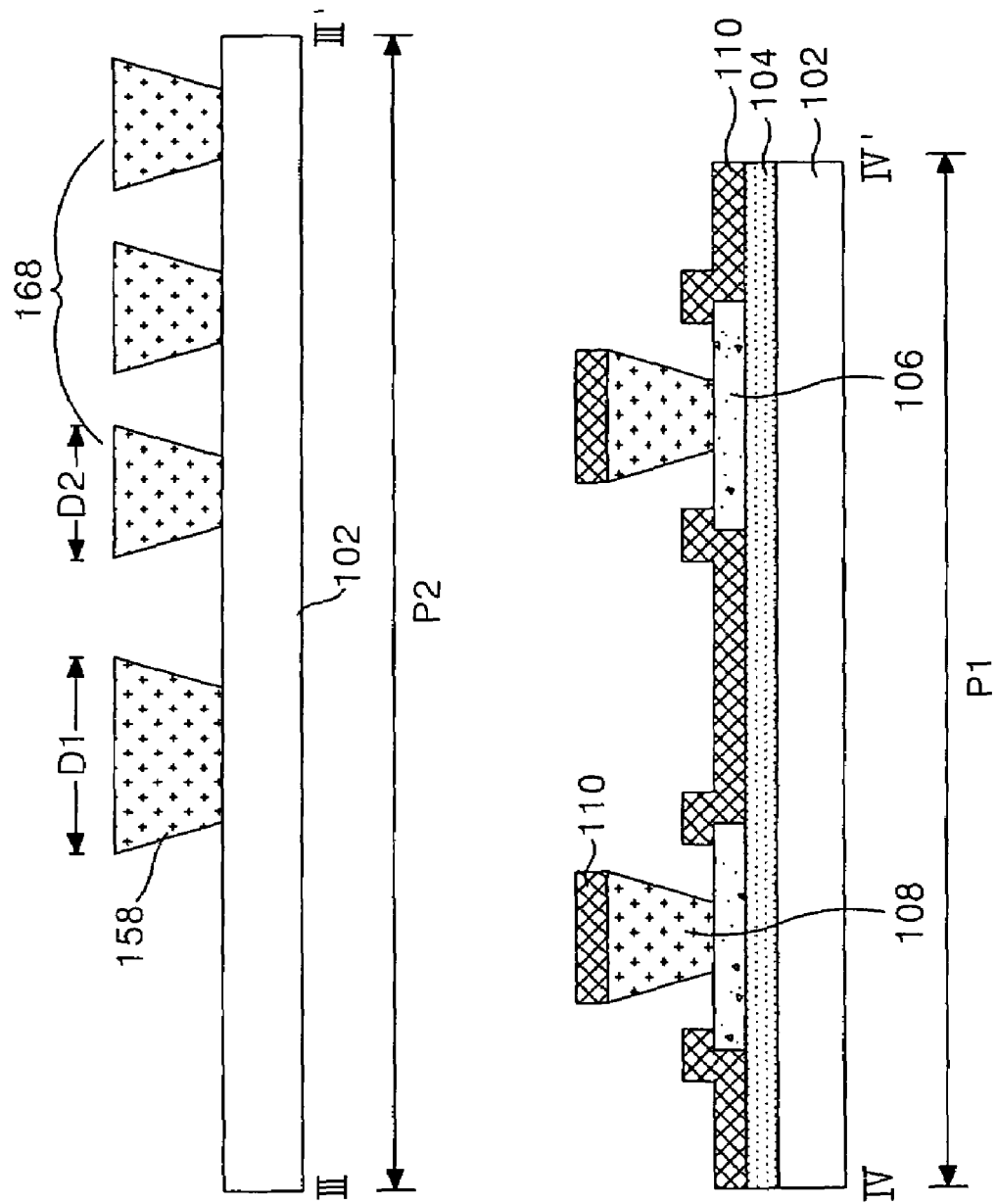

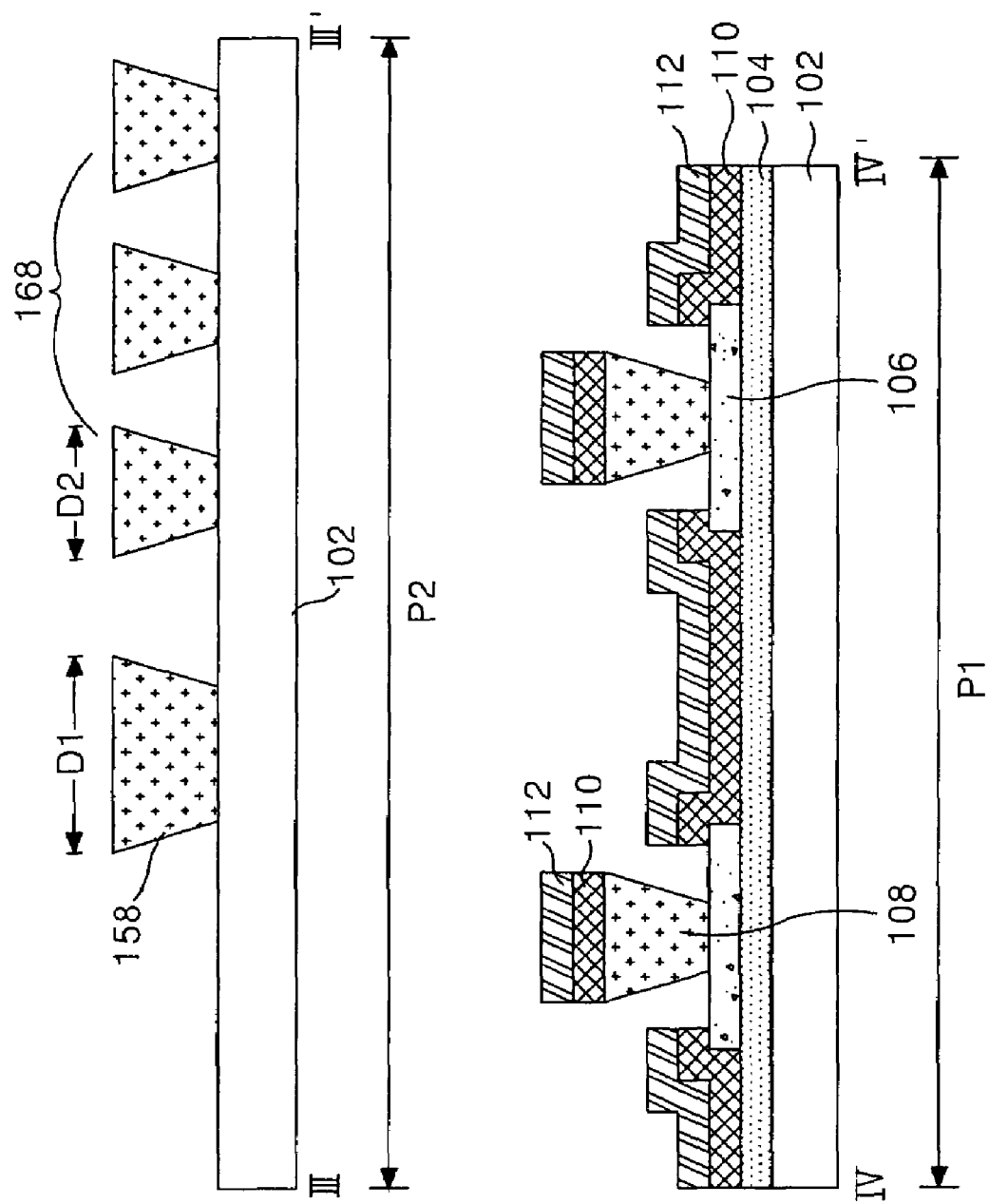

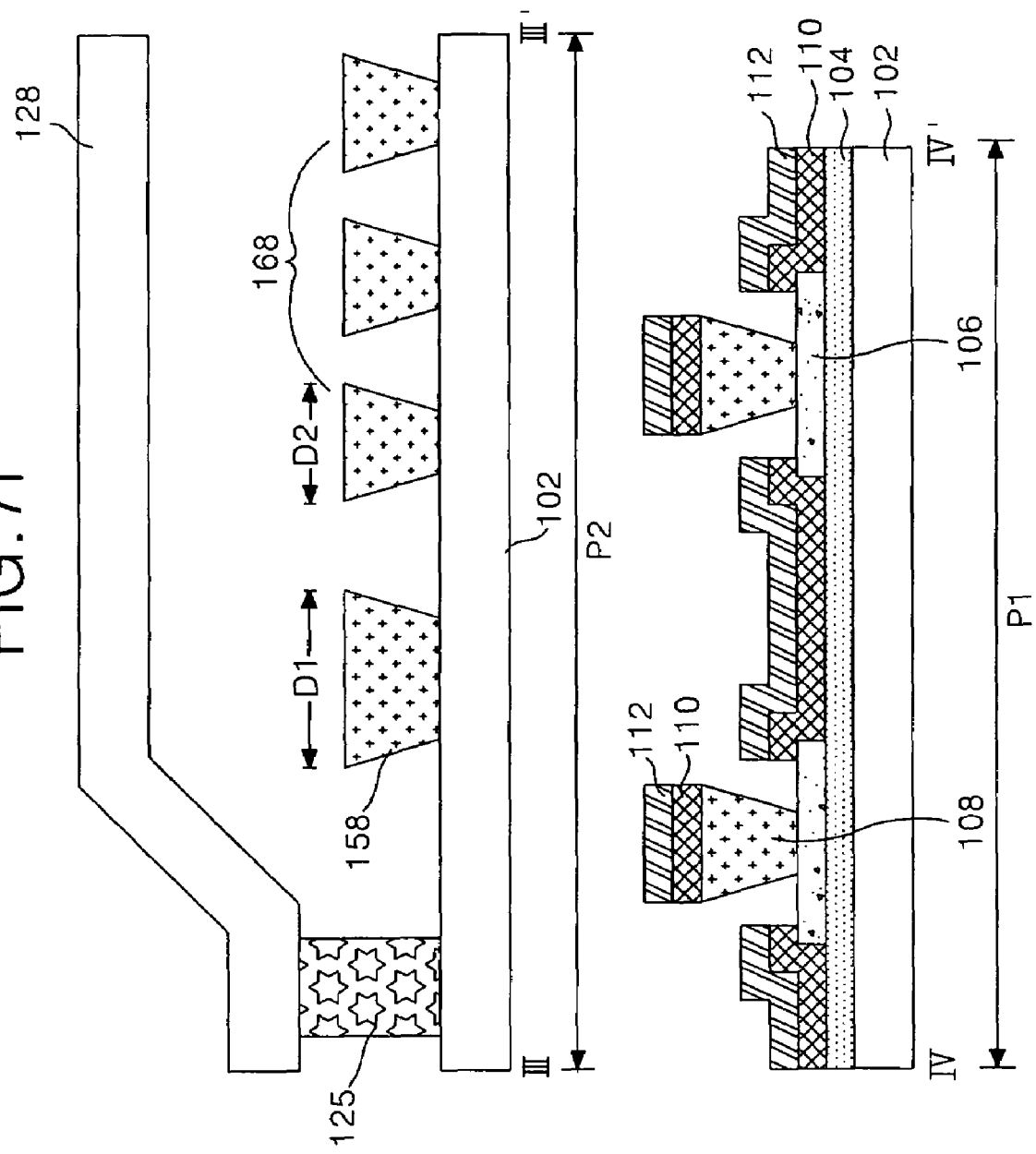

ORGANIC ELECTRO LUMINESCENCE DISPLAY DEVICE AND FABRICATING METHOD THEREOF

This application claims the benefit of the Korean Patent Application No. P2004-73282 filed on Sep. 14, 2004, which is hereby incorporated by reference.

BACKGROUND OF THE INVENTION

1. Field of the Invention

The present invention relates to an organic electro luminescence display device, and more particularly to an organic electro luminescence display device that is adaptive for preventing the deterioration of its light emitting efficiency and picture quality, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device.

Studies for increasing the picture quality and the size of the screen of the flat panel display device have been actively in progress. The EL display device among these is a self-luminous device which emits light by itself. The EL display device excites a phosphorus material by use of a carrier such as electrons and holes, thereby displaying a video image.

The EL display device is largely divided into an inorganic EL display device and an organic EL display device in accordance with a material used.

The organic EL display device is driven with a low voltage of about 5~20V in comparison with the inorganic EL display device which requires a high voltage of 100~200V so that a direct low voltage driving is possible. Further, the organic EL display device has excellent characteristics such as wide viewing angle, high speed response, high contrast ratio and so on, thus the organic EL display device can be used as a pixel of a graphic display and a pixel of a surface light source or a television image display, and the organic EL display device is a suitable next generation flat panel display because of its thinness and lightness and a good color sense.

FIG. 1 is a diagram briefly representing a general organic EL display device, FIG. 2 is a plane view specifically representing part (A area) of FIG. 1, and FIG. 3 is a sectional diagram illustrating a section of the organic EL display device which is cut along the lines I–I' and II–II' of FIG. 2.

The related art organic El display device shown in FIGS. 1 to 3 includes a display area P1 where there is formed an organic EL array inclusive of a driving electrode, e.g., anode electrode and cathode electrode, and a non-display area P2 where there is located a pad part 25 which supplies driving signals to the driving electrodes of the display area P1.

The organic EL array formed in the display area P1 has an anode electrode 4 formed on a substrate 2 and a cathode electrode 12 formed in a crossing direction to the anode electrode 4.

A plurality of anode electrodes 4 are formed on the substrate 2 to be separated from each other with a designated gap. An insulating film 6 having an aperture part is formed for each EL cell area on the substrate 2 where the anode electrode 4 is formed. Barrie ribs 8 are located on the insulating film 6 for separating an organic light emitting layer 10 and the cathode electrode 12 which are to be formed thereon. The barrier ribs 8 are formed in a direction of crossing the anode electrode 4 and have an overhang structure where an upper end part has a wider width than a lower end part. The organic light emitting layer 10 and the cathode electrode 12 formed of an organic compound are sequentially deposited over the entire surface of the insulating film 6 where the barrier ribs 8 are formed. The organic light emitting layer 10 has a hole injection layer, a hole transport layer, a light emitting layer, an electron transport layer and an electron injection layer deposited and formed on the insulating film 6.

In the non-display area P2, there are formed a first line 52 which is extended from a first electrode (or the anode electrode 4), data pads which supply a data voltage to the anode electrode 4 through the first line 52, a second line 53 which is connected to a second electrode (or the cathode electrode) 12, and a scan pad which supplies a scan voltage through the second line 53. Herein, an opaque conductive layer 52B for improving the conductivity of the second line 53 can be further formed on the second line 53. The data pad is connected to a TCP on which a first driving circuit generating the data voltage is mounted, to supply the data voltage to each anode electrode 4. The scan pad is formed at both sides of the data pad. The scan pad is connected to a TCP on which a second driving circuit generating a scan voltage is mounted, to supply the scan voltage to each cathode line 12.

The organic EL array of the display area P1 has a characteristic of being easily deteriorated by moisture and oxygen. In order to solve the problem, an encapsulation process is performed, thereby bonding a cap 28 and the substrate 2, where the organic EL array such as the anode electrode 2 is formed, together through a sealant 25 such as an epoxy resin. A getter for absorbing moisture and oxygen is filled in the center part of the rear surface, thereby protecting the organic EL array from the moisture and the oxygen.

In the related art organic EL display device having such a structure, if a voltage is applied between the anode electrode 4 and the cathode electrode 12 as shown in FIG. 4, an electron (or cathode) generated from the cathode electrode 12 moves toward the light emitting layer 10c through the electron injection layer 10a and the electron transport layer 10b. Further, a hole (or anode) generated from the anode electrode 4 moves toward the light emitting layer 10c through the hole injection layer 10e and the hole transport layer 10d. Accordingly, exitons are formed by a recombination of the electron and the hole which are supplied from the electron transport layer 10b and the hole transport layer 10b. The exitons are excited again to a ground state to emit a light of a fixed energy to the outside through the anode electrode 4, thereby displaying a picture.

On the other hand, in the organic EL display device, it often takes place that the sealant 25 flows into the organic EL array of the display area P1 through a space between the barrier ribs 8 when bonding the gap 28 and the substrate 2 together. The sealant 25 includes a lot of moisture, oxygen and impurities, thereby damaging the organic light emitting layer 10 of the organic EL array. Accordingly, there is a problem in that the light emitting efficiency and picture quality of the device is deteriorated.

SUMMARY OF THE INVENTION

Accordingly, it is an object of the present invention to provide an organic electro luminescence display device that is adaptive for preventing its light emitting efficiency and picture quality from being deteriorated by way of preventing a sealant from flowing into the organic electro luminescence display device, and a fabricating method thereof.

In order to achieve these and other objects of the invention, an organic electro luminescence display device according to an aspect of the present invention includes an organic electro luminescence array having first and second electrodes formed on a substrate with an organic light emitting layer therebetween, and a barrier rib in parallel to any one of the first and second electrodes; a protective barrier rib formed to cover the organic electro luminescence array; and at least one dummy barrier rib located inside a corner area of the protective barrier rib and formed to be bent along the protective barrier rib.

In the organic electro luminescence display device, ends of the dummy barrier ribs are connected to each other.

In the organic electro luminescence display device, the protective barrier rib has a relatively wider width than the barrier rib and the dummy barrier rib.

In the organic electro luminescence display device, the protective barrier rib is about 65~75 μm, and the barrier rib and the dummy barrier rib are about 10~20 μm.

A fabricating method of an organic electro luminescence display device according to another aspect of the present invention includes the steps of forming a first electrode in a display area of a substrate; forming an insulating film which exposes a light emitting area of the electrode; forming a barrier rib which is formed in the display area to cross the first electrode, a protective barrier rib which is formed to cover the display area, and at least one dummy barrier rib which is formed to be bent along the protective barrier rib; forming an organic light emitting layer in the light emitting area of the first electrode; and forming a second electrode which is formed to cross the first electrode with the organic light emitting layer therebetween.

In the fabricating method, the protective barrier rib has a relatively wider line width than the barrier rib and the dummy barrier rib.

In the fabricating method, ends of the dummy barrier ribs are connected to each other.

BRIEF DESCRIPTION OF THE DRAWINGS

These and other objects of the invention will be apparent from the following detailed description of the embodiments of the present invention with reference to the accompanying drawings, in which:

FIGS. 7A to 7F are diagrams representing a fabricating method of an organic electro luminescence display device according to an embodiment of the present invention.

DETAILED DESCRIPTION OF THE PREFERRED EMBODIMENT

Reference will now be made in detail to the preferred embodiments of the present invention, examples of which are illustrated in the accompanying drawings.

With reference to FIGS. 5 to 7F, embodiments of the present invention will be explained as follows.

Figure 1:
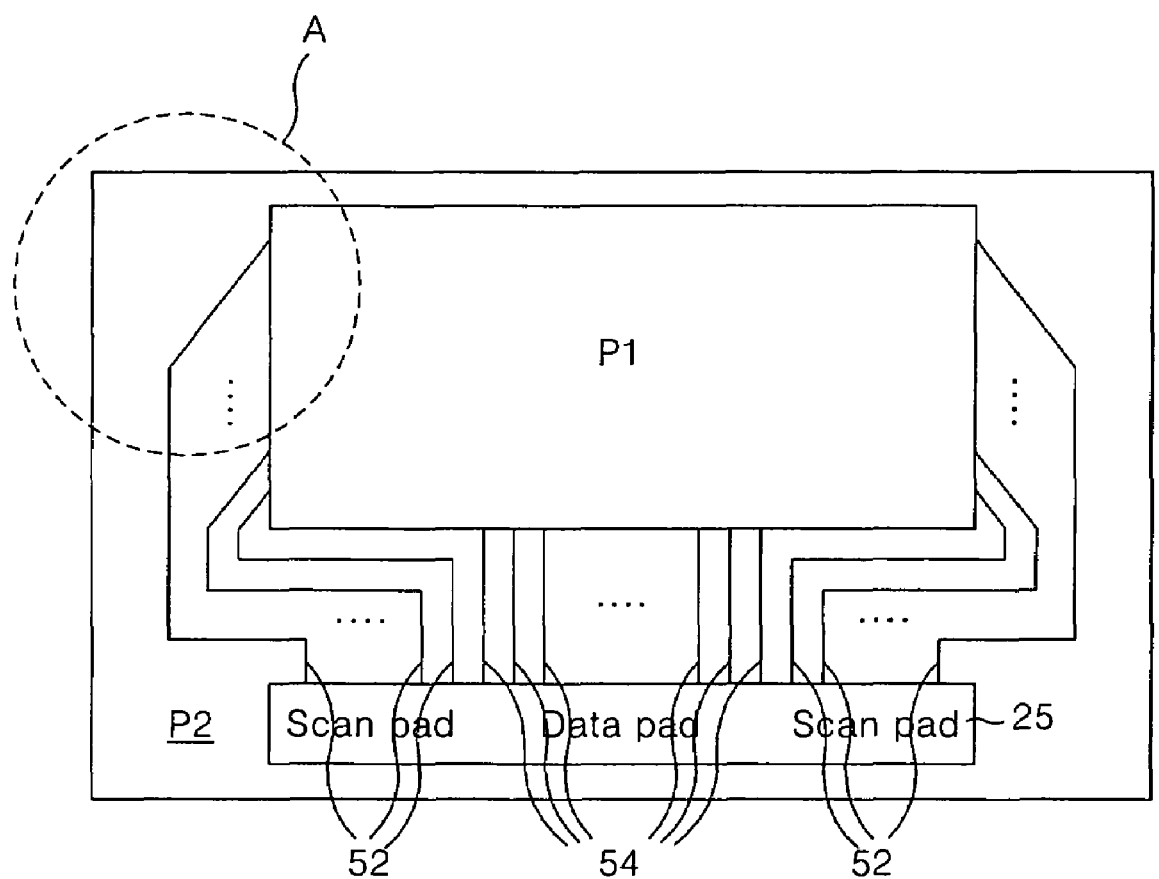
FIG. 1 a plane view briefly illustrating a related art organic electro luminescence display device.
Figure 2:
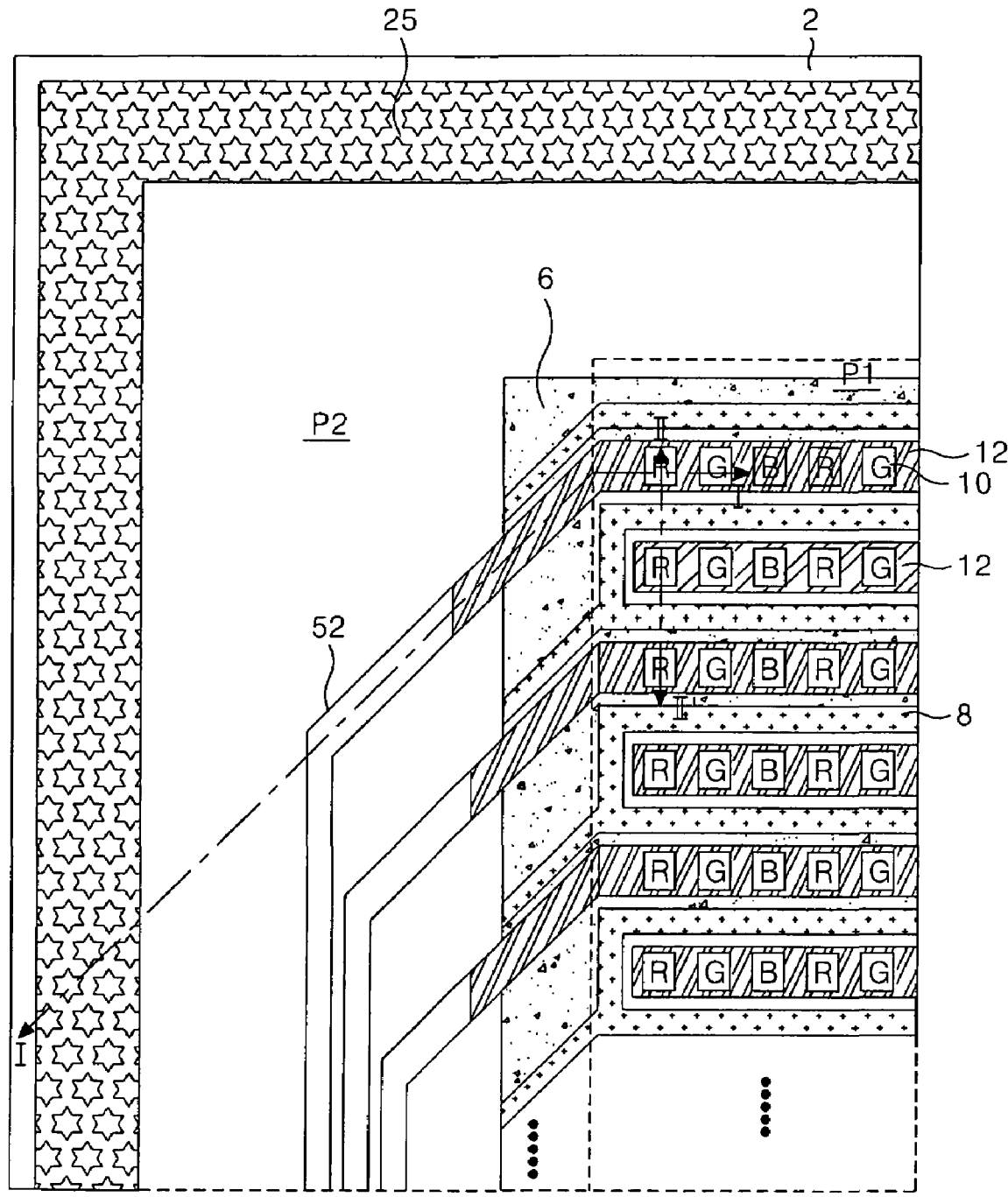
FIG. 2 is a diagram specifically representing an A area of an organic electro luminescence display device shown in FIG. 1.
Figure 3:
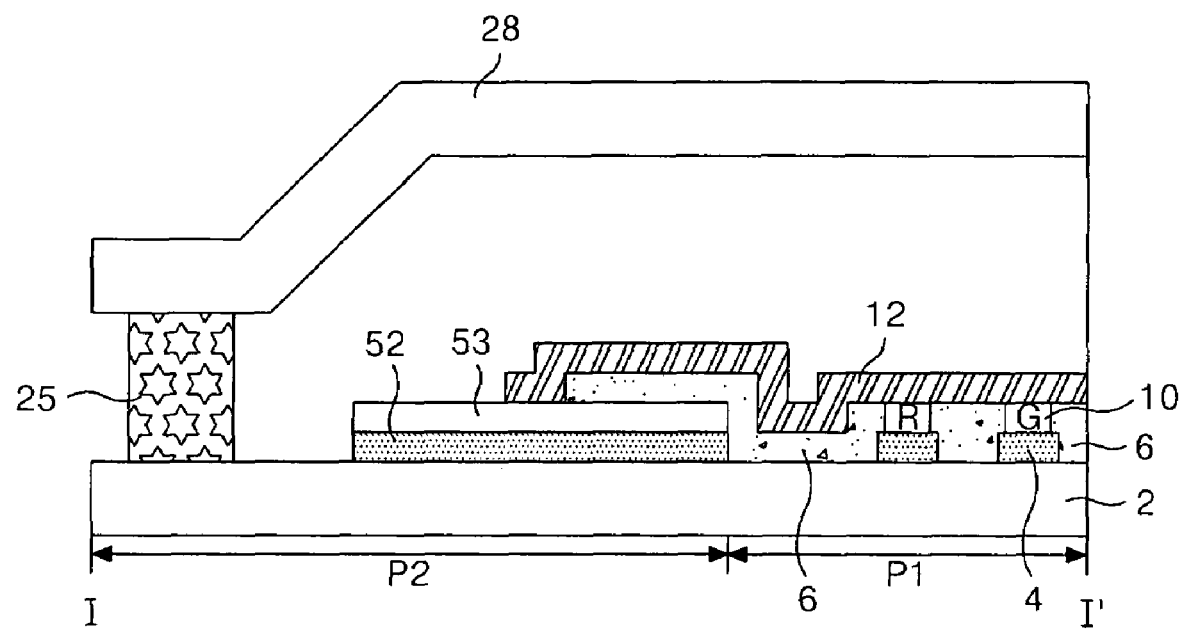
FIG. 3 is a sectional diagram illustrating the organic electro luminescence display device taken along the lines I–I' and II–II' shown in FIG. 2.
Figure 3:
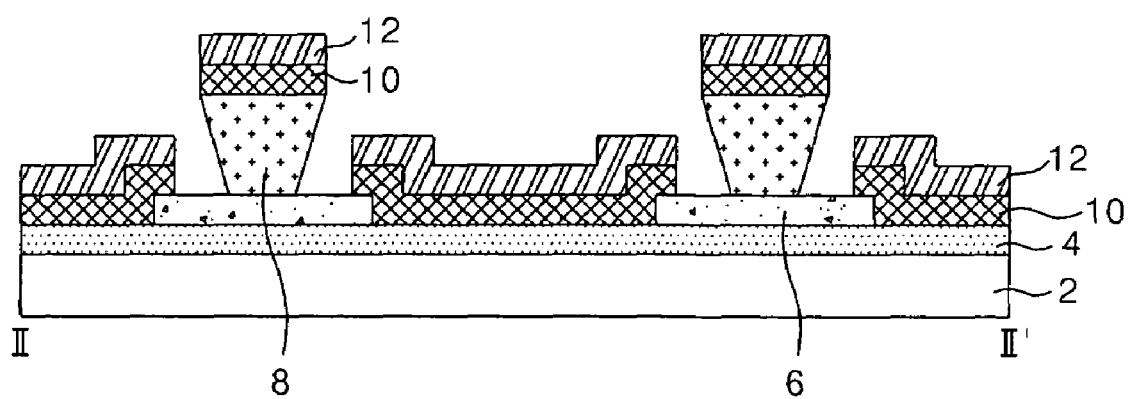
Figure 4:
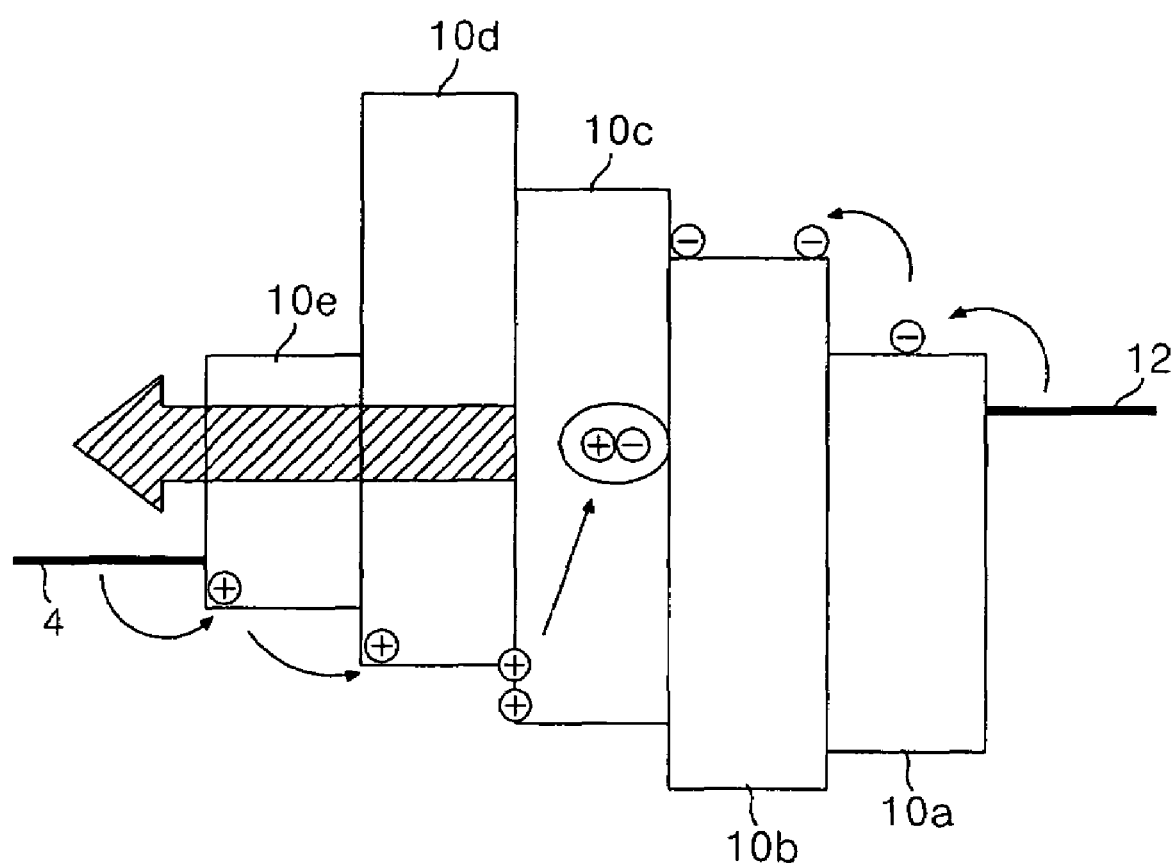
FIG. 4 is a diagram for explaining an light emitting principle of the related art organic electro luminescence display device.
Figure 5:
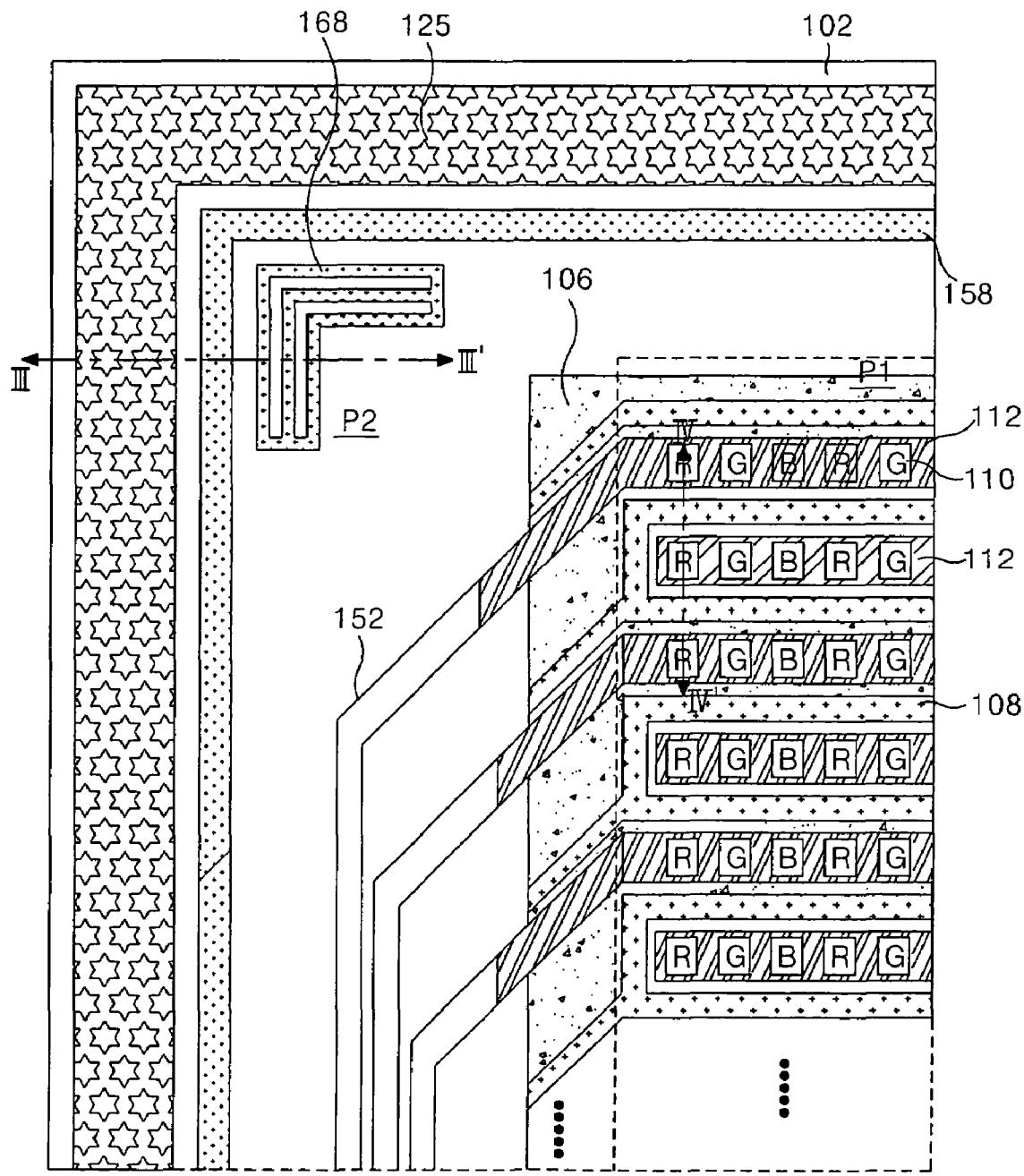
FIG. 5 is a diagram representing part of an organic electro luminescence display device according to an embodiment of the present invention.
Figure 6:
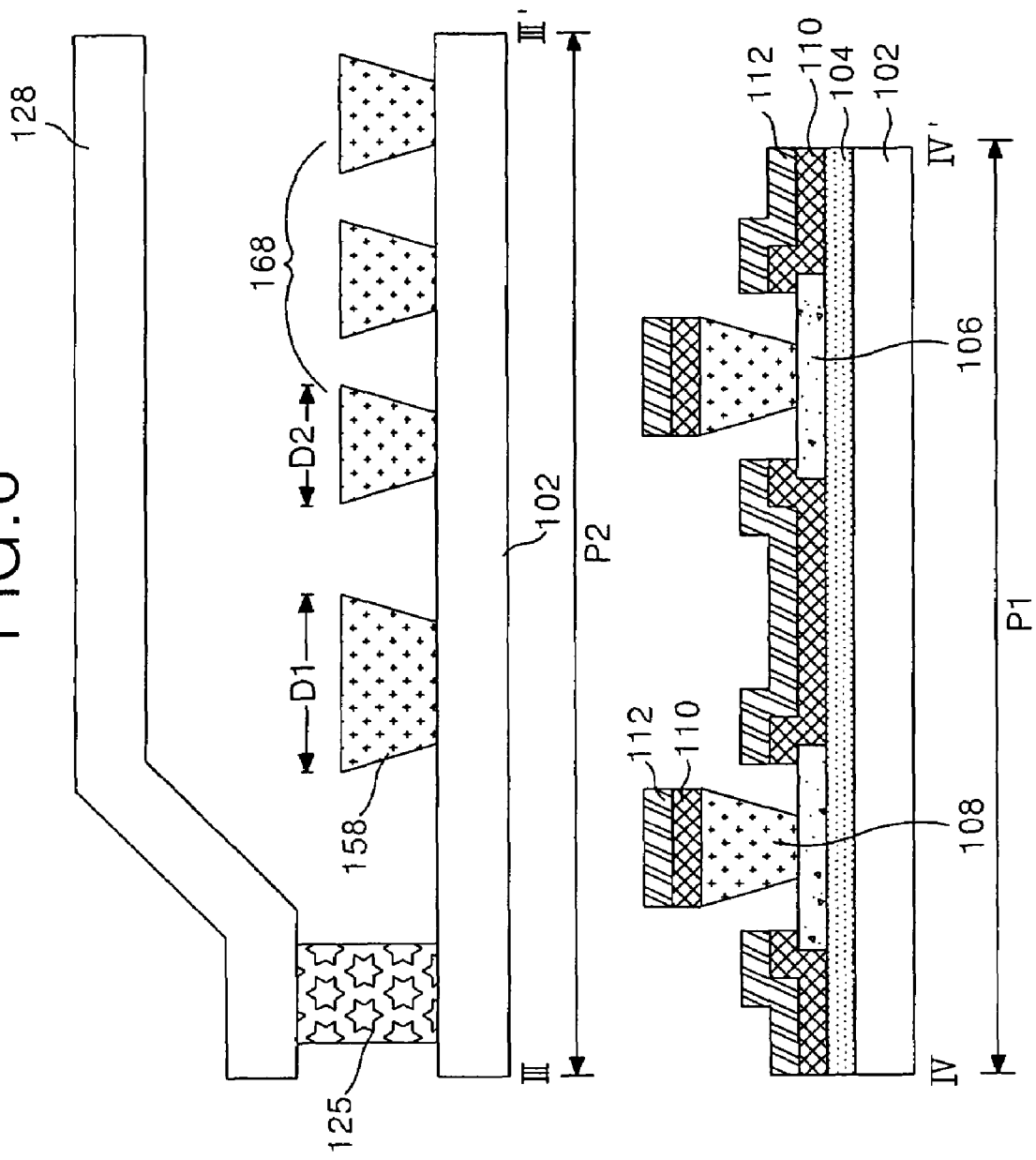
FIG. 6 is a sectional diagram illustrating the organic electro luminescence display device taken along the lines III–III' and IV–IV' shown in FIG. 5.

FIG. 5 is a diagram representing part of an organic EL display device according to an embodiment of the present invention, and FIG. 6 is a sectional diagram illustrating the organic EL display device taken along the lines III–III' and IV–IV' shown in FIG. 5.

The organic EL display device shown in FIGS. 5 and 6 includes a display area P1 where an organic EL array inclusive of an anode electrode and so on is formed, and a non-display area P2 where a pad part supplying driving signals to driving electrodes of the display area P1 is located.

In the display area P1, there is formed the organic EL array which includes an anode electrode 104 formed on a substrate 102 and a cathode electrode 112 formed in a direction of crossing the anode electrode 104.

A plurality of anode electrodes 104 are formed on the substrate 102 to be separated from each other with a designated distance. There is formed an insulating film 106 inclusive of an aperture part, which defines a light emitting area for each EL cell area, on the substrate 102 where the anode electrode 104 is formed. On the insulating film 106, there is formed a barrier rib 108 of an overhang structure in which an upper end part has a wider width than a lower end part.

The barrier rib 108 plays the role of separating an organic light emitting layer 110 and a cathode line 112 which are to be formed thereon.

The organic light emitting layer 110 and the cathode electrode 112 formed of an organic compound are sequentially deposited over the entire surface of the insulating film 106 where the barrier rib 108 is formed. The organic light emitting layer 110 has a hole injection layer, a hole transport layer, a light emitting layer, an electron transport layer and an electron injection layer deposited and formed on the insulating film 106.

In a non-display area P2, there are formed a first line (not shown) which is extended from the anode electrode 104 of the display area P1, a data pad which supplies a data voltage to the anode electrode 104 through the first line, a second line 152 which is connected to the cathode electrode 112, and a scan pad which supplies a scan voltage through the second line 152. Herein, the cathode electrode 112 is connected to the second line 152, and an opaque conductive layer 152B for improving the conductivity of the second line 152 might be further formed on the second line 152.

The data pad is connected to a TCP on which a first driving circuit generating a data voltage is mounted, to supply the data voltage to each anode electrode 104. The scan pad is formed at both sides of the data pad. The scan pad is connected to the TCP on which a second driving circuit generating a scan voltage is mounted, to supply the scan voltage to each cathode electrode 112.

In the non-display area P2, there is formed a protective barrier rib 158 which is formed to enclose the display area P1 inclusive of the organic EL array to protect the organic EL array. Further, at least one dummy barrier rib 168 is formed in each corner of the protective barrier rib 158 to be located inside the corner area of the protective barrier 158 and to be bent along the protective barrier 158.

The protective barrier rib 158 and the dummy barrier rib 168 play the role of protecting the organic EL array from a sealant 125 which is used when bonding the substrate 102 and a cap 128.

To describe this more specifically, it is as follows.

The sealant 125 often flows into the organic EL array of the display area P1 when bonding the cap (no shown) and the substrate 102 together. Especially, a relatively more amount of sealant 125 flow into the corner area of the display area P1.

Herein, the protective barrier rib 158 is formed to cover the display area P1, thereby playing the role of preventing the sealant 125 from flowing into the organic EL array. Further, even though a relative large amount of the sealant 125 is concentrated on the corner of the protective barrier rib 158 so that a small amount of sealant 125 run over the protective barrier rib 158, the sealant 125 is intercepted by at least one of dummy barrier ribs 168, thereby protecting the organic EL array.

Accordingly, the damage of the organic light emitting layer 110 of the organic EL array is prevented, thereby preventing the deterioration of the light emitting efficiency and the picture quality.

Herein, the protective barrier rib 158 has a relatively wider line width than the barrier rib 108 and the dummy barrier rib 168. For example, a line width D1 of the protective barrier rib 158 is about 65~75 μm, and a line width D2 of the barrier rib 108 and the dummy barrier rib 168 is about 10~20 μm.

Further, ends of at least one of the dummy barrier ribs 168 are formed to be connected to each other, thus a small amount of sealant 125 cannot escape from a space between the dummy barrier ribs 168 even though the small amount of sealant 125 flows into the space between the dummy barrier ribs 168, thereby making perfection more perfect in protecting the organic EL array.

In this way, the organic electro luminescence display device according to the present invention includes the protective barrier rib 158 which is formed to cover the organic electro luminescence array, and at least one dummy barrier rib 168 which is located inside each corner area of the protective barrier rib 158 and is formed to be bent along the protective barrier rib 158. Accordingly, the organic EL array formed in the display area P1 is covered by the protective barrier rib 158 and a large amount of sealant flowing into the corner of the display area is intercepted by the dummy barrier rib 168, thereby preventing the damage of the organic light emitting layer 110. Hereby, it is possible to prevent the deterioration of the light emitting efficiency and the picture quality.

FIGS. 7A to 7F are diagrams for explaining a fabricating method of an organic EL display device according to the present invention.

Figure 7A:
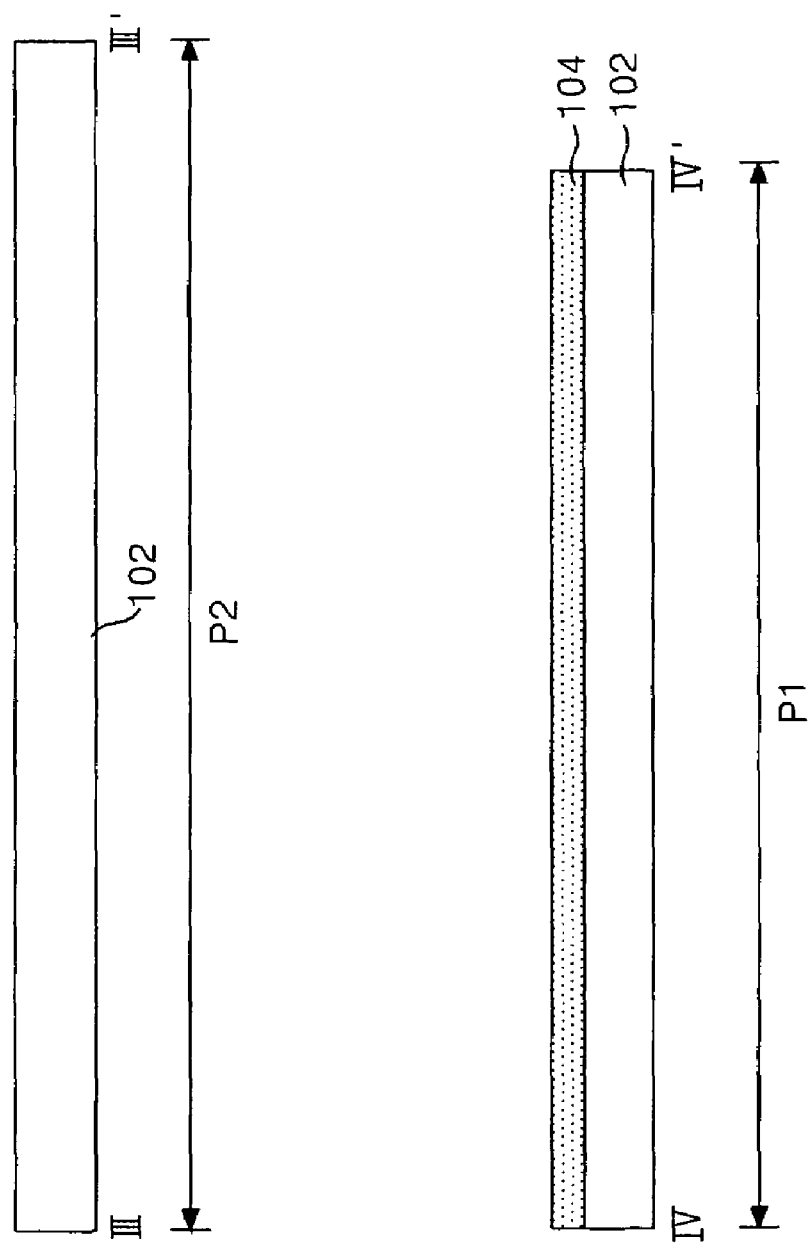

Firstly, after depositing a transparent conductive metal material on the substrate 102 which is formed by use of soda lime or hard glass, the transparent conductive metal material is patterned by a photolithogaphy process and an etching process, thereby forming the anode electrode (not shown), the first line (not shown) and the second line 152, as shown in FIG. 7A. Herein, the metal material is indium tin oxide or SnO2. After then, on the second line, there might be formed an opaque conductive layer which might improve the conductivity of the second line 152.

Figure 7B:
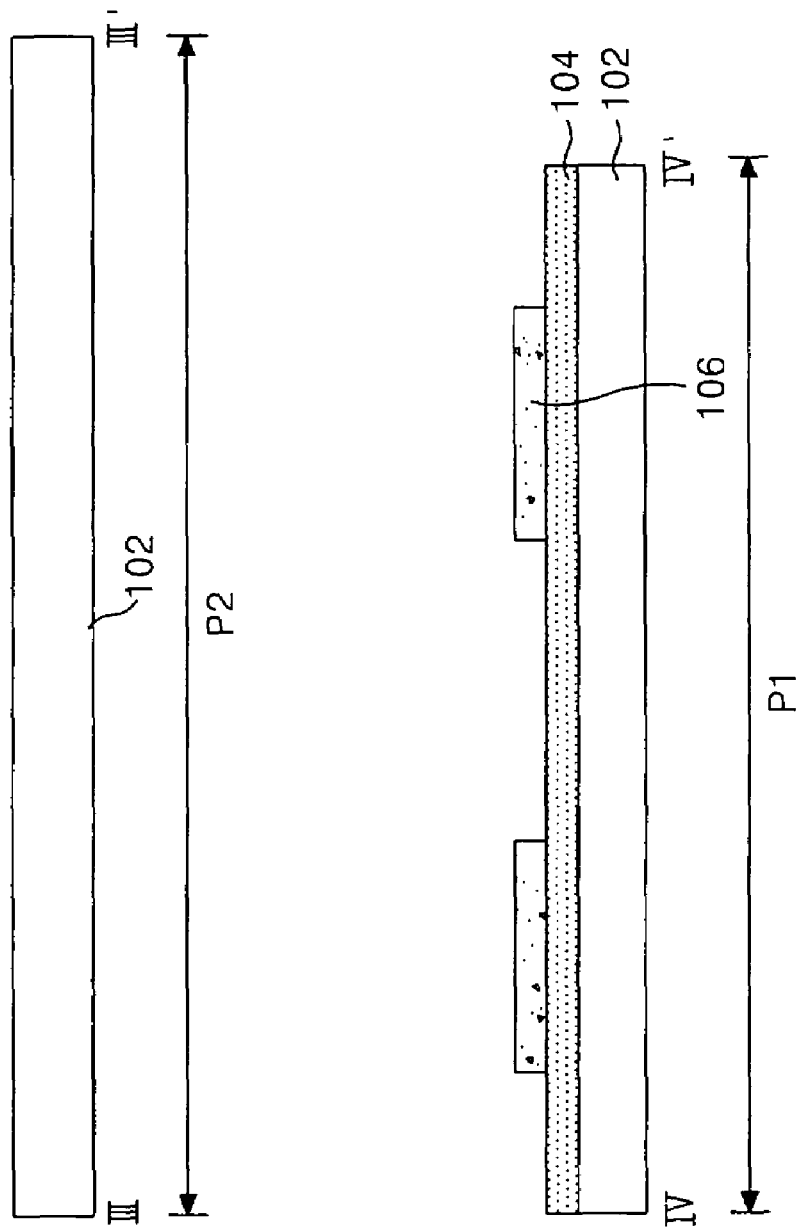

After a photo sensitive insulating material is coated by a spin coating method on the substrate 102 where the anode electrode 104 and the second line 152 are formed, the photo sensitive insulating material is patterned by the photolithog-raphy process and the etching process, thereby forming an insulating film 106 which exposes the light emitting area of the display area P1, as shown in FIG. 7B.

After a photo sensitive organic material is deposited on the insulating film 106, the photo sensitive organic material is patterned by the photolithography process and the etching process, thereby forming the barrier rib 108, the protective barrier rib 158 and the dummy barrier rib 168, as shown in FIG. 7C.

The barrier rib 108 is formed in the non-light emitting area of the display area P1 to cross a plurality of anode electrodes 4 for dividing pixels, and the protective barrier rib 158 is formed to cover the display area P1 inclusive of the organic EL array. The dummy barrier rib 168 is formed to be located inside each corner area and be bent along the protective barrier rib 158, and the end of each dummy barrier rib 168 is connected to each other.

The protective barrier rib 158 has a relatively wider line width than the barrier rib 108 and the dummy barrier rib 168. For example, a line width D1 of the protective barrier rib 158 is about 65~75 μm, and a line width D2 of the barrier rib 108 and the dummy barrier rib 168 is about 10~20 μm.

After then, as shown in FIG. 7D, the organic light emitting layer 110 is formed on the light emitting area of the anode electrode 104.

A metal material is deposited on the substrate 102 where the organic light emitting layer 110, thereby forming the cathode electrode 112 to be connected to the second line 152 and to be parallel to the barrier rib 108, as shown in FIG. 7E.

After then, as shown in FIG. 7F, the substrate 102 where the organic EL array is formed is bonded together with the cap 128 through the sealant 125.

As described above, the organic EL display device and the fabricating method thereof according to the present invention has the protective barrier rib formed to cover the organic electro luminescence array and at least one dummy barrier rib formed to be located inside each corner area of the protective barrier rib and to be bent along the protective barrier rib, thereby preventing the damage of the organic light emitting layer caused by the sealant used when bonding the cap and the substrate. Hereby, it is possible to prevent the deterioration of the light emitting efficiency and the picture quality.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device, comprising:
    an organic electro luminescence array having first and second electrodes formed on a substrate with an organic light emitting layer therebetween, and a barrier rib in parallel to any one of the first and second electrodes;
    a protective barrier rib formed to enclose the organic electro luminescence array; and
    at least one dummy barrier rib located inside a corner area of the protective barrier rib and formed to be bent along the protective barrier rib.

2. The organic electro luminescence display device according to claim 1, wherein when the number of the at least one dummy barrier rib is at least two, ends of the at least two dummy barrier ribs are connected to each other.

3. The organic electro luminescence display device according to claim 1, wherein the protective barrier rib has a relatively wider width than the barrier rib and the dummy barrier rib.

4. The organic electro luminescence display device according to claim 1, wherein a line width of the protective barrier rib is about 65~75 μm, and line widths of the barrier rib and the dummy barrier rib are about 10~20 μm.

5. A fabricating method of an organic electro luminescence display device, comprising the steps of:
   forming a first electrode in a display area of a substrate;
   forming an insulating film which exposes a light emitting area of the electrode;
   forming a barrier rib which is formed in the display area to cross the first electrode, a protective barrier rib which is formed to enclose the display area, and at least one dummy barrier rib which is formed to be bent along the protective barrier rib;
   forming an organic light emitting layer in the light emitting area of the first electrode; and
   forming a second electrode which is formed to cross the first electrode with the organic light emitting layer therebetween.

6. The fabricating method according to claim 5, wherein the protective barrier rib has a relatively wider line width than the barrier rib and the dummy barrier rib.

7. The fabricating method according to claim 5, wherein when the number of the at least one dummy barrier rib is at least two, ends of the at least two dummy barrier ribs are connected to each other.

* * * * *